United States Patent [19]
Russ

[11] 3,942,065
[45] Mar. 2, 1976

[54] MONOLITHIC, MILTICOLOR, LIGHT EMITTING DIODE DISPLAY DEVICE

[75] Inventor: Malcolm J. Russ, Scottsdale, Ariz.

[73] Assignee: Motorola, Inc., Chicago, Ill.

[22] Filed: Nov. 11, 1974

[21] Appl. No.: 522,548

Related U.S. Application Data

[63] Continuation of Ser. No. 230,923, Feb. 29, 1972, abandoned.

[52] U.S. Cl................................. 313/500; 357/17
[51] Int. Cl.² ........................................ H05B 33/26
[58] Field of Search...................... 313/500; 357/17; 315/169 TV; 250/553

[56] References Cited
UNITED STATES PATENTS

| | | | |
|---|---|---|---|
| 3,290,539 | 12/1966 | Lamorte | 313/500 X |
| 3,517,258 | 6/1970 | Lynch | 315/169 TV |
| 3,536,830 | 10/1970 | Hakki | 315/169 TV |
| 3,558,974 | 1/1971 | Stewart | 315/169 TV |
| 3,611,069 | 10/1971 | Galginaitis et al. | 357/17 |
| 3,636,397 | 1/1972 | Addamiano et al. | 313/500 |
| 3,641,390 | 2/1972 | Nakamura | 313/500 X |
| 3,703,656 | 11/1972 | Barnett et al. | 313/500 |
| 3,737,704 | 6/1973 | Grenon et al. | 313/500 |

OTHER PUBLICATIONS

"Lighting Up in a Group," by L. A. Murray et al., Electronics, Mar. 4, 1968, pp. 104–110.

*Primary Examiner*—Palmer C. Demeo
*Attorney, Agent, or Firm*—Harry M. Weiss; Henry T. Olsen

[57] ABSTRACT

There is disclosed a multicolor monolithic light display comprising a pair of matrices of light emitting diodes in an integral structure which pair of matrices are alternately or simultaneously scannable to produce a red, green or orange display. One matrix includes a plurality of gallium arsenide phosphide ($GaAs_xP_{1-x}$) red light emitting diodes while the other matrix includes gallium phosphide green light emitting diodes. The light emitting diodes are arranged in a geometric pattern of columns and rows with the first matrix interposed with the second matrix so that an alphanumeric character produced by one matrix will appear at almost the same physical location as a character of the alternate color. Row and column address lines are provided for each matrix so that a strobing format logic address system can affect lighting of the individual diodes for producing an alphanumeric character or graphic display in either one color or the other or if both matrices are addressed simultaneously in a combined color. There are also disclosed alternate methods of manufacturing the foregoing multicolor display.

3 Claims, 4 Drawing Figures

MONOLITHIC, MILTICOLOR, LIGHT EMITTING DIODE DISPLAY DEVICE

This is a continuation, of application Ser. No. 230,923, filed Feb. 29, 1972, now abandoned.

BACKGROUND OF THE INVENTION

This invention relates to alphanumeric displays and more particularly to a multicolor alphanumeric display. Still more particularly the invention is related to a multicolor monolithic light emitting diode display which is scannably addressable to produce characters in alternative or simultaneous colors.

As pointed out in the co-pending application of Michael G. Coleman and John A. Keil, Ser. No. 198,221 filed Nov. 12, 1971, and assigned to the present assignee, visual readout devices such as alphanumeric displays, are utilized for many purposes such as computer readouts, process control instrumentation, aircraft and automotive instrument panels and various other indicators such as clocks and gauges. In many of these uses it would be desirable if the display could operate in a differential color mode so as to provide an additional indicator of the meaning of the information. For example, a direct reading altimeter for an aircraft might be programmed so that altitudes below a certain height might appear in a distinctive color to further warn the pilot of the position of the aircraft. Also, since the multicolor basically can occupy the same panel space as a single color display two distinct types of information may be displayed in the same panel space by the use of one color to indicate one type of information and another color to indicate still another type of information. Thus, a multicolor display can occupy less space and provide additional functions not presently available from standard display devices.

The practical realization of the matrix display of this type requires precision photolithography as developed for semiconductor integrated circuits and silicon material by planar processing. While the aforementioned patent application results in a useful multicolor display, it does require the use of liquid epitaxy process to grow efficient red light emitting gallium phosphide (Zn-O) diodes. Liquid epitaxial processes do not readily produce a precision, flat epitaxial growth. Thus, it is preferred to utilize with the accordance of the invention an alternative material, gallium arsenide phosphide, for the red emitting diodes which material can be grown by a vapor epitaxial process. Further, in any matrix display which is directly addressable from logic and which has no intrinsic memory in the display itself the total display must be scanned faster than the eye responds.

Obviously if there are several thousand elements in the display then the time in which current flows through a given segment is short to obtain reasonable brightness and extremely high current level must be passed through the segment during this short address time. If this type of time sharing is to be successful in large displays it is essential that the light output be proportional to the current so that the pulse brightness during the short address time is usefully high. Red light emitting gallium phosphide (Zn-O) suffers from the defect that it saturates at modest current level. Thus, it is desirable again to use the gallium arsenide phosphide as the red emitting material because this material has a characteristic wherein the brightness is proportional to current up to very high current levels.

SUMMARY OF THE INVENTION

It is a primary object of this invention to provide an improved multicolor display device wherein gallium arsenide phosphide is utilized for the red emitting diodes.

A further object of the invention is to provide a method of manufacturing the aforementioned monolithic light emitting diode display device.

In accordance with the aforementioned objects there is provided a multicolor light display comprising a first matrix of gallium phosphide light emitting diodes and a second matrix of gallium arsenide phosphide light emitting diodes each of said matrices being arranged in columns and rows in an epitaxially graded monolithic structure.

THE DRAWINGS

Further objects and advantages of the invention will be obvious to one skilled in the art from the following complete description thereof and from the drawings wherein.

DETAILED DESCRIPTION

Figure 1:
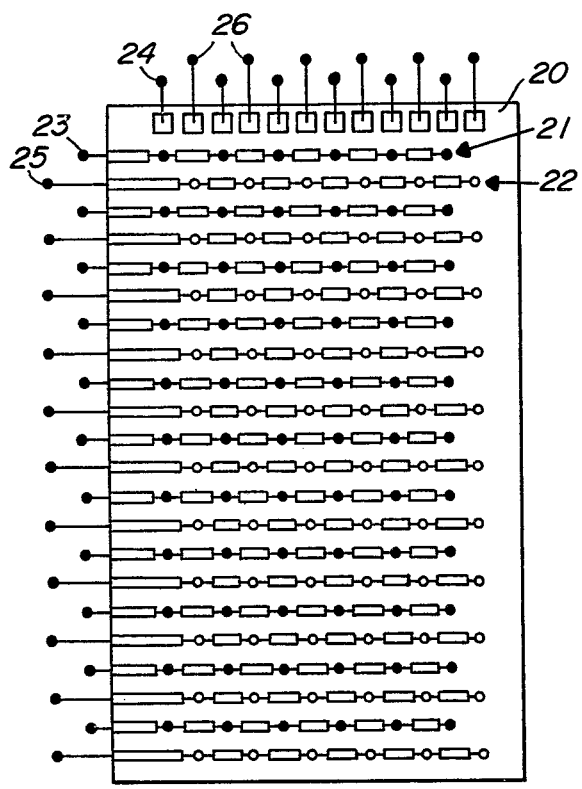
FIG. 1 is a plan view of a multicolor monolithic light emitting diode display device in accordance with the preferred embodiment of the invention depicted herein somewhat schematically.

In accordance with the preferred embodiment of the invention there is shown in FIG. 1 the multicolor light emitting diode array comprising a monolithic semiconductor support structure 20 containing a plurality of green light emitting diodes 21 and a second plurality of red light emitting diodes 22 in a pair of geometric matrices of rows and columns. The green light emitting diodes 21 are addressed by row address lines 23 and column address lines 24. A red light emitting diode 22 is addressed by row address lines 25 and column address lines 26. As shown, each matrix has a row of six diodes and a column containing eleven diodes making a total of 66 light emitting diodes in each matrix. Through the address lines 23, 24, 25 and 26, a suitable strobing or scanning type logic can individually address any of the light emitting diodes to cause each to emit light in a suitable alphanumeric pattern in either or both colors. In the preferred embodiment of the invention the column lines 24 and 26 are connected to a single diffused conductive tunnel which simplifies the interconnection pattern. However, if desired the metalization may take a more conventional two-layer metalization pattern.

Figure 2:
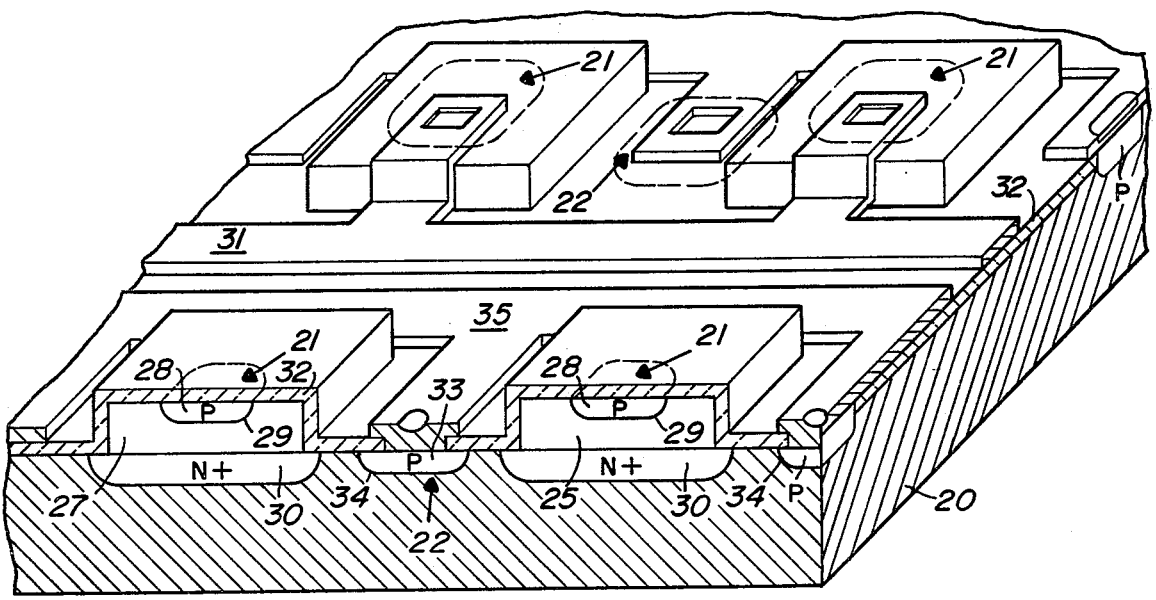
FIG. 2 is an isometric view of a portion of the device of FIG. 1 in partial cross section.

The display is shown in greater detail in FIG. 2 wherein the substrate 20 has thereon a plurality of mesas 27 of N type gallium phosphide. Diffusions 28 of zinc or cadmium doping material form PN junctions 29 in each of the mesas 27. A highly conductive channel or tunnel 30 underlies the mesa and connects with the column address line 24 to define the cathode contact. The conductive channel 30 is highly doped with either tellurium, sulphur or selenium. Anode contact for each of the green light emitting diodes 21 is obtained through metalization stripes 31 overlying the dielectric layer 32 which covers the substrate 20 in mesas 27. The stripes 31 connect to the row address lines 23. The metalization stripes 31 make contact to the anodes through suitable windows as is well known.

The matrix of red light emitting diodes 22 is interspersed between the mesas 27 by the formation of diffusions 33 of zinc or cadmium doping to form PN junctions 34 in the surface region of the body of the substrate 20. The anodes of the light emitting diodes 22 are contacted by suitable metalization stripes 35 which form the row contact connections to the row address line 25 and the column address lines 26 can contact the cathodes of the diodes 22 through the conductive channel 30. Obviously if the resistivity of the channel 30 is too high for proper addressing, a second layer of metalization can be formed on top of the substrate and mesas to form column connection stripes.

Figure 3:
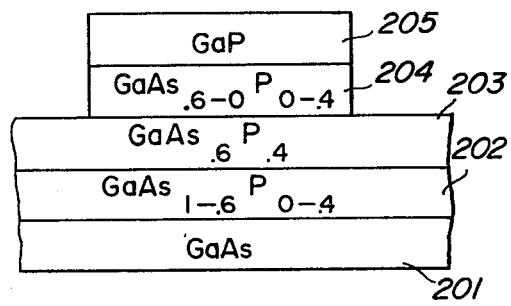
FIG. 3 is a partial cross section depicting a monolithic structure in accordance with the embodiment of the invention and FIG. 4 is another partial cross section of another embodiment of the monolithic structure.

The graded material structure of the monolithic array in accordance with the preferred embodiment of the invention is depicted in FIG. 3 and is schematically represented showing a starting substrate 201 of gallium arsenide which may be doped to give it an N conductivity. By suitable vapor deposition techniques an epitaxial layer graded in composition from 100% gallium arsenide to a final composition of about 60% gallium arsenide ($GaAs_{.6}P_{.4}$) is grown thereon from a source of gallium arsenic and phosphorus. During the vapor epitaxial process an increasing amount of phosphine bas is introduced in the process to grade the layer 202 until $GaAs_{.6}P_{.4}$ is attained. Epitaxial deposition is then continued to form a coherent uniform layer 203 of $GaAs_{.6}P_{.4}$, preferably, N doped with tellurium, sulphur or selenium to form the N regions for the red light emitting diodes. The wafer is the removed from the epitaxial chamber and the diffusion forming the channels 30 may then be formed by suitable photolithographic techniques. A mask defining what will be the mesa regions 27 is then placed over the wafer and following which epitaxial grading from $GaAs_{.6}P_{.4}$ continues to form the layer 204 which grades to gallium phosphide by eliminating arsenic from the vapor deposition sourcing material. A uniform layer of gallium phosphide suitably doped with tellurium, selenium, or sulphur is then deposited to form the N conductivity region of the green light emitting diodes. It will be apparent that the graded gallium arsenide phosphide layer 204 and gallium phosphide layer 205 may be made uniform across the entire wafer and the mesas formed by etching techniques thereafter.

Figure 4:
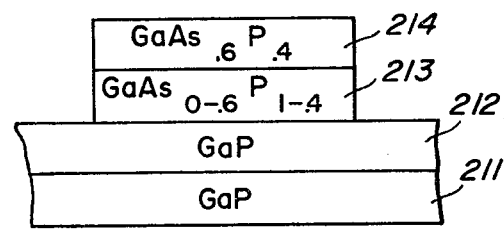

An alternative process for graded growth of gallium phosphide and $GaAs_{.6}P_{.4}$ structure necessary for producing the multicolor display is schematically depicted in FIG. 4 wherein the starting substrate 211 is gallium phosphide upon which a layer 212 of N doped gallium phosphide is epitaxially produced. Following suitable masking a graded layer 213 of $GaAs_{.6}P_{.4}$ is grown to form mesas and a coherent uniform layer 214 of $GaAs_{.6}P_{.4}$ doped to provide suitable N conductivity is grown thereon to form suitable mesas. In accordance with the alternative embodiment it will be apparent that the red light emitting diodes 22 will then be produced in the mesa regions while the green light emitting diodes 21 will be produced in the gallium phosphide layer 212 by suitable P diffusions.

While it has been assumed in the foregoing, that either gallium arsenide or gallium phosphide wafers have been utilized as the starting material it will be apparent to one skilled in the art that silicon or germanium wafers may be utilized and epitaxial layers of gallium arsenide or gallium phosphide deposited thereon followed by the aforementioned graded deposition and mesa growing steps to produce the necessary structure. It will also be not that the $GaAs_xP_{1-x}$ may be $GaAs_{0.2}P_{0.8}$ to emit yellow light. Within the above mentioned disclosure it will be appreciated that suitable further modifications may be made therein without departing from the spirit and scope of the invention.

What is claimed is:

1. A multicolor monolithic light display comprising at least a first matrix of gallium phosphide light emitting diodes and a second matrix of $GaAs_xP_{1-x}$ light emitting diodes in an integral structure which matrices are scannable to produce a display in a first or a second color, the light emitting diodes being arranged in a geometric pattern of columns and rows with the first matrix interspersed with the second matrix and each of said diodes having a junction exposed at the top surface of said structure, and column and line address means arranged about the periphery of the display, said means including pairs of spaced parallel metallization stripes extending between said diodes, each of said pairs of metallization stripes having contact means extending in opposite directions to contact one of said matrices.

2. A display as recited in claim 1 wherein one of said matrices is formed in a matrix of mesas and the other of said matrices is formed in the spaces below and between said mesas.

3. A display as recited in claim 2 wherein said mesas are contacted by a conductive tunnel underlying said mesas.

* * * * *